United States Patent
Wang et al.

(10) Patent No.: US 9,856,572 B2
(45) Date of Patent: Jan. 2, 2018

(54) ADDITIVE FOR REDUCING VOIDS AFTER ANNEALING OF COPPER PLATING WITH THROUGH SILICON VIA

(71) Applicant: Shanghai Sinyang Semiconductor Materials Co., Ltd., Shanghai (CN)

(72) Inventors: Su Wang, Shanghai (CN); Xianxian Yu, Shanghai (CN); Li Ma, Shanghai (CN); Yanyan Li, Shanghai (CN)

( * ) Notice: Subject to any disclaimer, the term of this patent is extended or adjusted under 35 U.S.C. 154(b) by 0 days.

(21) Appl. No.: 14/909,745

(22) PCT Filed: Dec. 25, 2013

(86) PCT No.: PCT/CN2013/001643
§ 371 (c)(1),
(2) Date: Feb. 3, 2016

(87) PCT Pub. No.: WO2015/017960
PCT Pub. Date: Feb. 12, 2015

(65) Prior Publication Data
US 2016/0168738 A1    Jun. 16, 2016

(30) Foreign Application Priority Data
Aug. 8, 2013 (CN) .......................... 2013 1 0343223

(51) Int. Cl.
| | |
|---|---|
| C08K 5/06 | (2006.01) |
| C25D 3/38 | (2006.01) |
| C25D 5/50 | (2006.01) |
| C25D 7/12 | (2006.01) |
| H01L 21/288 | (2006.01) |
| H01L 21/768 | (2006.01) |

(52) U.S. Cl.
CPC .............. C25D 3/38 (2013.01); C25D 5/50 (2013.01); C25D 7/123 (2013.01); *H01L 21/2885* (2013.01); *H01L 21/76898* (2013.01)

(58) Field of Classification Search
CPC ....................................................... C25D 3/38

USPC ......................................................... 524/377
See application file for complete search history.

(56) References Cited

U.S. PATENT DOCUMENTS

| 4,110,176 A | 8/1978 | Creutz et al. |
| 2011/0290659 A1* | 12/2011 | Roeger-Gopfert ... C08G 73/024 205/297 |

FOREIGN PATENT DOCUMENTS

| CN | 103290438 A | 9/2013 |
| CN | 103397354 A | 11/2013 |

OTHER PUBLICATIONS

Bu, Hua et al., "Novel Additives and Brightening Agent for Acidic Copper Plating" Materials Protection, vol. 10, Oct. 30, 2004 (Oct. 30, 2004), ISSN: ISSN 1001-1560, main body, sections 1 and 2.

* cited by examiner

Primary Examiner — Hui Chin
(74) Attorney, Agent, or Firm — Jigang Jin

(57) ABSTRACT

An additive for reducing voids after annealing of copper plating with through silicon via. The additive contains by weight percent: 0.05-1% of one or more of quaternized polyethylene imine and derivatives thereof having different molecular weights, and 1-10% of polyethylene glycol with an average molecular weight of 200-20000. The additive is used in combination with an electroplating solution of a copper methyl sulfonate system. The electroplating solution of a copper methyl sulfonate system contains 1-5 ml/L of the additive by volume ratio. The electroplating solution of a copper methyl sulfonate system contains by mass volume ratio: 50-110 g/L of copper ions, 5-50 g/L of methanesulfonic acid and 20-80 mg/L of chlorine ions. The electroplating solution also contains by volume ratio: 0.5-5 ml/L of accelerator, 5-20 ml/L of inhibitor and 5-10 ml/L of levelling agent. The additive for reducing voids after annealing of copper plating with through silicon via provided in the present invention can solve the problem of micro-voids between grain boundaries after high temperature annealing of copper plating.

8 Claims, 4 Drawing Sheets

ADDITIVE FOR REDUCING VOIDS AFTER ANNEALING OF COPPER PLATING WITH THROUGH SILICON VIA

CROSS-REFERENCE TO RELATED APPLICATIONS

This application is the U.S. National Stage of International Application No. PCT/CN2013/001643, filed Dec. 25, 2013, which claims priority to Chinese application No. 201310343223.3, filed Aug. 8, 2013, the contents of which are incorporated herein by reference in their entirety.

TECHNICAL FIELD

The invention involves an additive for the through silicon via copper plating process, in particular, relates to an additive for reducing voids after annealing of copper plating with through silicon via.

BACKGROUND ART

With the rapid development of the electric information industry, and the promotion of market demands and advances, the capacity of the information transmission has been increased, requiring high-speed signal transmission and treatment. The traditional 2D integration technologies may lead to signal distortion and delay. Therefore, 3D integration technologies are used to reduce wiring, realize multi-layer integration, improve performance and reduce power consumption. During the utilization of the 3D technologies, Through Silicon Via (TSV) technology has played an important role, which could make the 3D interconnection come true.

TSV manufacturing technologies mainly include: formation of through holes; depositions of the insulating layer, barrier layer and seed layer; and the electroplating and removal of the through holes and the electroplating of the re-distribution lead (RDL). During the electroplating of the through holes, two method could be used, namely, conformal plating and super-conformal plating which is also called bottom-up plating, as shown in FIG. 1 and FIG. 2 respectively.

The bottom-up plating has the following characteristics in terms of hole filling compared with the conformal plating: the development in the blind hole is started from the bottom directly in the U-shape, and there is only a very thin plating layer on the whole wall, which may improve the electroplating speed to the maximum extent. Micro-voids could be found between the grain boundaries in the TSV copper column for the bottom-up plating after the annealing due to the development pattern and the piling pattern during the copper deposition, which may influence the confidence. Therefore, an electroplating additive or process is needed to eliminate the micro-voids between grain boundaries after the annealing of the TSV electroplating.

Annealing process is a heat treatment process for metal, which is to heat the metal to certain temperature slowly, maintain the temperature for a while and then cool the metal at the appropriate speed. The purpose of the annealing is to reduce the hardness and improve machinability; eliminate residual stress, stabilize sizes and reduce deformation and cracks; and refine grains, adjustment organization and eliminate organization flaws. However, during the bottom-up electroplating copper annealing, while the Cu grain is developing and integrating, micro-voids may develop between different grains.

DISCLOSURE OF THE INVENTION

The purpose of the invention is to provide an additive that can eliminate the micro-void between the grain boundaries of the electroplating copper of TSV micro holes with the major components of polyethylene imine derivatives. Adding the additive could reduce the micro-voids between grain boundaries of the TSV copper column after annealing.

In order to achieve the above-mentioned purpose, the invention has provided an additive for reducing voids after annealing of copper plating with through silicon via. The additive contains by weight percent: 0.05-1% of one or more of quaternized polyethylene imine and derivatives thereof having different molecular weights, and 1-10% of polyethylene glycol with an average molecular weight of 200-20000.

The general formula of the said quaternized polyethylene imine is:

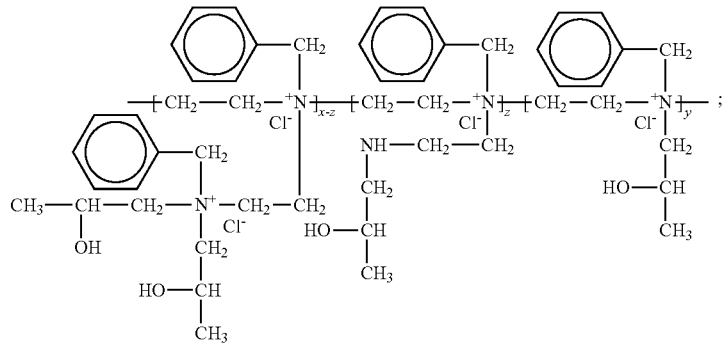

according to the degree of polymerization of the polyethylene imine and the different quantities of the atoms N, the corresponding changes in the molecular weight is carried out.

The said additive is used in combination with an electroplating solution of a copper methyl sulfonate system.

The said electroplating solution of a copper methyl sulfonate system contains 1-5 ml/L of said additive by volume ratio.

The said electroplating solution of a copper methyl sulfonate system contains by mass volume ratio: 50-110 g/L of copper ions, 5-50 g/L of methanesulfonic acid and 20-80 mg/L of chlorine ions.

The said electroplating solution also contains by volume ratio: 0.5-5 ml/L of accelerator, 5-20 ml/L of inhibitor and 5-10 ml/L of levelling agent.

The said accelerator contains one or several kinds from the combined sulfur compounds of poly dithiobis propanesulfonic acid disodium, alcohlpropane sulfonate sodium, phenyl dithio propanesulfonic acid sodium, 3-S-isothiuronium propanesulfonic acid sodium salt, 3-mercapto-1-propanesulfonate sodium salt and, dimethyl-dithiocarbamyl sulfonate, isothiourea propanesulfonic acid sodium salt, 3-(benzothiazol-2-ylthio)-1-propanesulfonate sodium salt, methyl-(sulfopropyl)disulfide disodium salt, methyl-(sulfopropyl)trisulfide disodium salt. The said accelerator is sulfur compound, which could be used to polish and refine the grains.

The said inhibitor contains one or several kinds of the combined with an average molecular weight from 2000-20000 of polyethylene glycol, polyethylene oxide, fatty alcohol alkoxylates, poly propylene glycol, polyethylene glycol dimethyl ether, polypropylene oxide glycol, mercaptobenzimidazole, ethylene oxide-propylene oxide block copolymer. The said inhibitor is oxygenated compound with the major functions of wetting and inhibition, which could inhibit the deposition speed of the copper in the region with high current density.

The said levelling agent contains one or several kinds of the combined with different molecular weight of fatty alcohol-polyoxyethylene ether series, alkylphenol polyoxyethylene ether series, emulsifier TX series, thiourea compounds, alkyl pyridine compounds, and Janus Green B. The said leveling agent has such functions as wetting and leveling, which could impede the deposition of the plated layers by sterically hindered or electrochemical action, so as to assist the refining of the grains and ensure the uniform thickness of the plated layers under the high-speed deposition condition. Under the action of the electric field, the accelerator, inhibitor and leveling agent could make a synergistic effect to obtain reliable and excellent plating layer.

Compared with the prior art, the present invention has the following advantages and technical effects:

The invention has simple formulation and easy operation without any chemicals that may be harmful to the environment. Using the electroplating solution containing the additive to prepare TSV plating copper could ensure rapid deposition speed and obtain the TSV copper columns without micro-voids between the grain boundaries after annealing.

DESCRIPTION OF THE PREFERRED EMBODIMENTS

Figure 1:
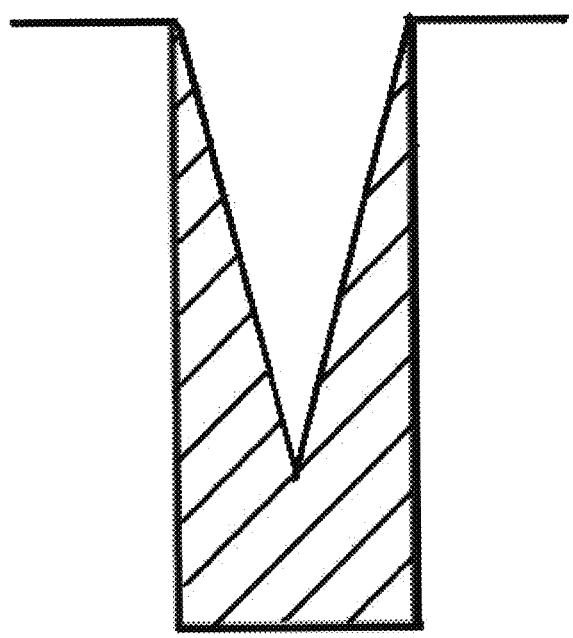
FIG. 1 is a schematic diagram for the conformal filling mode.
Figure 2:
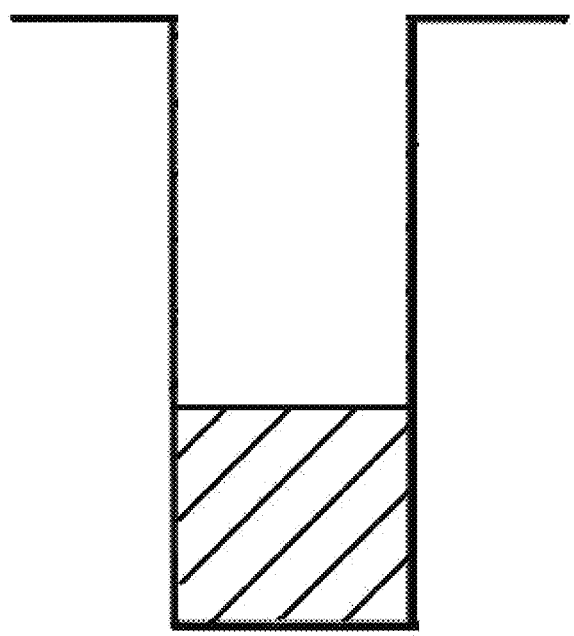
FIG. 2 is a schematic diagram for bottom-up filling mode.

The following illustration with figures will make a further description about the embodiments of this present invention.

The additive provided in the present invention for reducing voids after annealing of copper plating with TSV contains by weight percent: 0.05-1% of one or more of quaternized polyethylene imine and derivatives thereof having different molecular weights, and 1-10% of polyethylene glycol with an average molecular weight of 200-20000.

The general formula of the said quaternized polyethylene imine is:

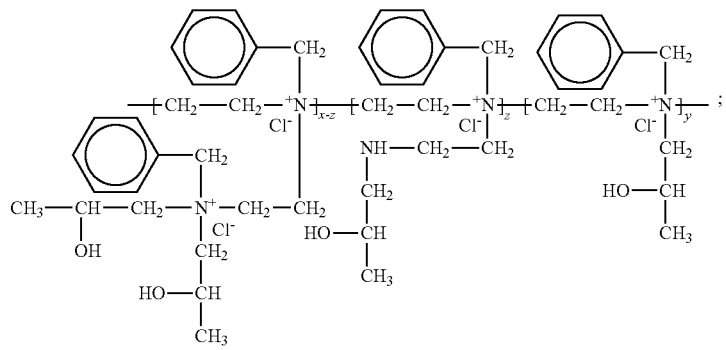

according to the degree of polymerization of the polyethylene imine and the different quantities of the atoms N, the corresponding changes in the molecular weight is carried out.

The additive is used in combination with an electroplating solution of a copper methyl sulfonate system. The electroplating solution of a copper methyl sulfonate system contains 1-5 ml/L of additive by volume ratio.

The electroplating solution of a copper methyl sulfonate system contains by mass volume ratio: 50-110 g/L of copper ions, 5-50 g/L of methanesulfonic acid and 20-80 mg/L of chlorine ions.

The electroplating solution also contains by volume ratio: 0.5-5 ml/L of accelerator, 5-20 ml/L of inhibitor and 5-10 ml/L of levelling agent.

The accelerator contains one or several kinds from the combined sulfur compounds of poly dithiobis propanesulfonic acid disodium, alcohlpropane sulfonate sodium, phenyl dithio propanesulfonic acid sodium, 3-S-isothiuronium propanesulfonic acid sodium salt, 3-mercapto-1-propanesulfonate sodium salt and, dimethyl-dithiocarbamyl sulfonate, isothiourea propanesulfonic acid sodium salt, 3-(benzothiazol-2-ylthio)-1-propanesulfonate sodium salt, methyl-(sulfopropyl)disulfide disodium salt, methyl-(sulfopropyl)trisulfide disodium salt. The accelerator is sulfur compound, which could be used to polish and refine the grains.

The inhibitor contains one or several kinds of the combined with an average molecular weight from 2000-20000 of polyethylene glycol, polyethylene oxide, fatty alcohol alkoxylates, poly propylene glycol, polyethylene glycol dimethyl ether, polypropylene oxide glycol, mercaptobenzimidazole, ethylene oxide-propylene oxide block copolymer. The inhibitor is oxygenated compound with the major functions of wetting and inhibition, which could inhibit the deposition speed of the copper in the region with high current density.

The levelling agent contains one or several kinds of the combined with different molecular weight of fatty alcohol-polyoxyethylene ether series, alkylphenol polyoxyethylene ether series, emulsifier TX series, thiourea compounds, alkyl pyridine compounds, and Janus Green B. The leveling agent has such functions as wetting and leveling, which could impede the deposition of the plated layers by sterically hindered or electrochemical action, so as to assist the refining of the grains and ensure the uniform thickness of the plated layers under the high-speed deposition condition.

Under the action of the electric field, the accelerator, inhibitor and leveling agent could make a synergistic effect to obtain reliable and excellent plating layer. Its operation principle is: in the TSV process, after copper plating, the wafer shall be annealed, and then carry on the CMP (Chemical-Mechanical Planarization). If there are micro-voids between the grain boundaries after the annealing of the TSV copper column, etch pits may be seen on the surface of the copper column after CMB, lading to failure. Adding quaternized polyethylene imine and PEG in the plating liquid could change the copper deposition grain direction and sizes during the electroplating, make the sizes of the grains are similar and the crystallization directions are same, which may avoid the micro-voids between the grain boundaries due to the different grain sizes and the mess directions of the crystallization.

The method of using the additive provided in the invention for reducing voids after annealing of copper plating with TSV is: after uniformly stirring the methanesulfonic acid copper plating solution pro rata containing accelerator, inhibitor and leveling agent, add the additive of the invention into the liquid, stir the mixture uniformly and use the wafer electroplating equipment for electroplating.

The conditions of the copper TSV electroplating using the above electroplating solution of a copper methyl sulfonate system are as follows:

Current density: 0.01-10 A/dm$^2$; plating liquid temperature: 15-30° C.; optimized plating conditions: current density: 0.1-1 A/dm$^2$, and temperature: 20-25° C.

The proportion for the examples 1-3 are shown in Table 1.

The specific electroplating process is: firstly, prepare the electroplating solution of a copper methyl sulfonate system and additive, and add the additive into the electroplating solution; then, wet the TSV microvias through the plating pre-treatment; and then connect the wafer of the TSV to the cathode of the power supply, fully immerse the wafer electroplating surface into the electroplating solution, and conduct the electroplating with the step-by-step current method of rotating or stirring the cathode. After the electroplating, washing the wafer completely clean with deionized water, drying it by spinning or blowing.

Electroplating Conditions:

Prtreatment: Vacummizing for 5 minutes at 0.2 torr, and immersing with pure water for 1 minute;

Equipment test conditions: flow=15 L/min; cathode rotation rate=50 RPM.

Electroplating parameters: current during diffusion: 0.01 ASD; diffusion duration: 1-10 min.

Electroplating current: 0.3-0.5 ASD.

ASD is ampere/square decimeter

Figure 3:
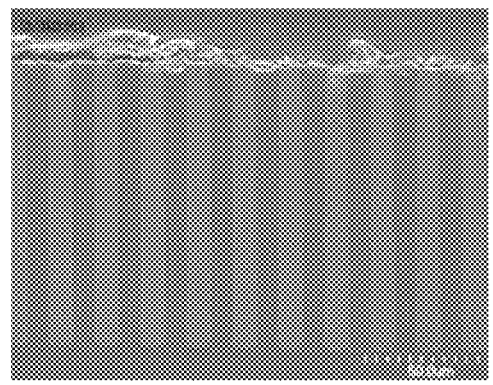
FIG. 3 is a schematic diagram about the TSV electroplating effect of the additive for reducing voids after annealing of copper plating with TSV of the invention.

The TSV electroplating effect profile is shown in FIG. 3.

Figure 4:
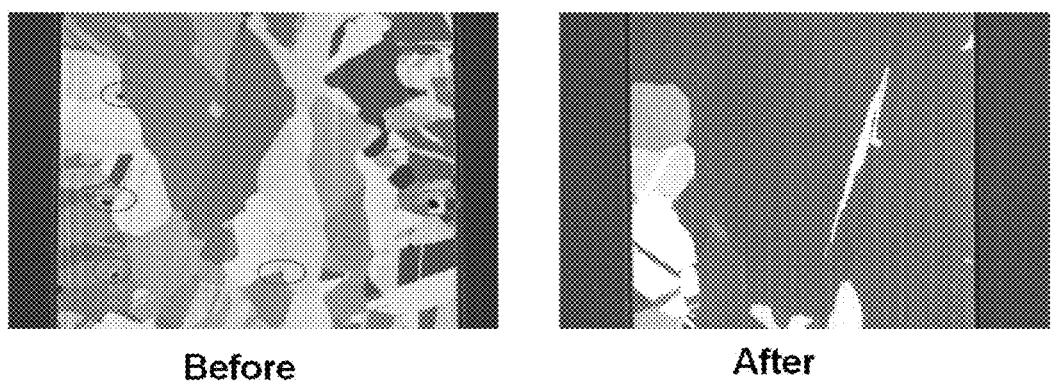
FIG. 4 is an diagram about the comparison between the electroplating effects before and after adding the additive for reducing voids after annealing of copper plating with TSV of the invention.

The effect contrast with and without the additive provided in the invention as shown in FIG. 4 can be seen the micro-voids disappeare after adding the additive.

The additive provided in the invention for reducing voids after annealing of copper plating with TSV, can be used with the electroplating processes to realize the bottom-up electroplating filling. After adding the additive, the micro-voids between the grain boundaries after the high-temperature annealing of the electroplating copper have been eliminated.

Despite the detailed introduction to the invention as above, the above introduction could not be considered as the limitation to the invention. After the technical personnel in the field have read the above contents, the modifications and alternations of the invention will be obvious. Therefore, the protection scope of the invention shall be limited by the attached claims.

The invention claimed is:

1. An additive for reducing voids after annealing of copper plating with through silicon via, wherein, the additive contains by weight percent: 0.05-1% of one or more of quaternized polyethylene imine and derivatives thereof having different molecular weights, and 1-10% of polyethylene glycol with an average molecular weight of 200-20000, wherein, general formula of the said quaternized polyethylene imine is:

TABLE 1

Proportion of the electroplating solution used to reduce the
micro-voids between the grain boundaries after the annealing
of TSV microvia electroplating.

| | Copper ions | Methanesulfonic acid | Chlorine ions | Current density | Accelerator | Inhibitor | Leveling agent | Additive |
|---|---|---|---|---|---|---|---|---|
| Example 1 | 60 g/L | 10 g/L | 30 mg/L | 0.5 A/dm$^2$ | 3 ml/L | 8 ml/L | 5 ml/L | 1 ml/L |
| Example 2 | 90 g/L | 20 g/L | 50 mg/L | 0.5 A/dm$^2$ | 2 ml/L | 14 ml/L | 6 ml/L | 2 ml/L |
| Example 3 | 110 g/L | 10 g/L | 80 mg/L | 0.5 A/dm$^2$ | 5 ml/L | 6 ml/L | 10 ml/L | 3 ml/L |

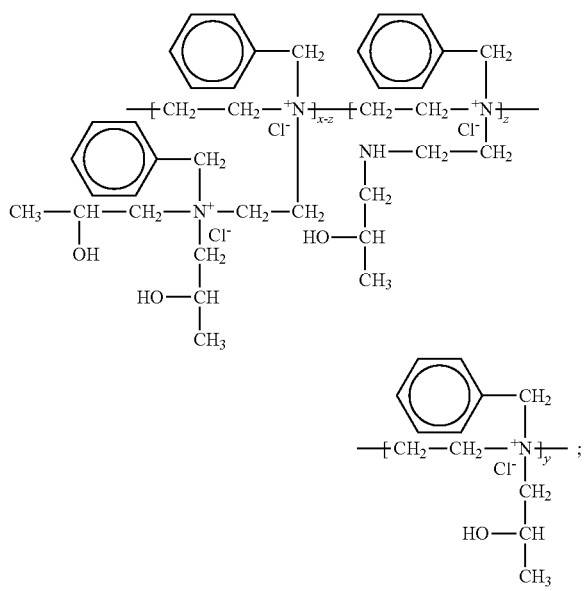

wherein x-z, z, and y represent the degree of polymerization of the polyethylene imine, and according to the degree of polymerization of the polyethylene imine and the different quantities of the atoms N, the corresponding changes in the molecular weight is carried out.

2. The additive for reducing voids after annealing of copper plating with through silicon via of claim 1, wherein, said additive is used in combination with an electroplating solution of a copper methyl sulfonate system.

3. The additive for reducing voids after annealing of copper plating with through silicon via of claim 2, wherein, the volume of said additive:the volume of said electroplating solution of a copper methyl sulfonate system is 1-5 mL:1 L.

4. The additive for reducing voids after annealing of copper plating with through silicon via of claim 2, wherein, said electroplating solution of a copper methyl sulfonate system contains copper ions, methyl sulfonic acid, and chlorine ions, and the mass of said copper ions:the mass of said methyl sulfonic acid:the mass of said chlorine ions:the volume of said electroplating solution is 50-110 g:5-50 g:20-80 mg:1 L.

5. The additive for reducing voids after annealing of copper plating with through silicon via of claim 4, wherein, said electroplating solution also contains accelerator, inhibitor and levelling agent, and the volume of said accelerator: the volume of said inhibitor:the volume of said levelling agent:the volume of said electroplating solution is 0.5-5 mL:5-20 mL:5-10 mL:1 L.

6. The additive for reducing voids after annealing of copper plating with through silicon via of claim 5, wherein, said accelerator contains one or several kinds from the combined sulfur compounds of polydithiobis propanesulfonic acid disodium, alcohlpropane sulfonate sodium, phenyl dithio propanesulfonic acid sodium, 3-S-isothiuronium propanesulfonic acid sodium salt, 3-mercapto-1-propanesulfonate sodium salt and, dimethyl-dithiocarbamyl sulfonate, isothiourea propanesulfonic acid sodium salt, 3-(benzothiazol-2-ylthio)-1-propanesulfonate sodium salt, methyl-(sulfopropyl) disulfide disodium salt, methyl-(sulfopropyl) trisulfide disodium salt.

7. The additive for reducing voids after annealing of copper plating with through silicon via of claim 5, wherein, said inhibitor contains one or several kinds of the combined with an average molecular weight from 2000-20000 of polyethylene glycol, polyethylene oxide, fatty alcohol alkoxylates, polypropylene glycol, polyethylene glycol dimethyl ether, polypropylene oxide glycol, mercaptobenzimidazole, ethylene oxide-propylene oxide block copolymer.

8. The additive for reducing voids after annealing of copper plating with through silicon via of claim 5, wherein, said levelling agent contains one or several kinds of the combined with different molecular weight of fatty alcohol-polyoxyethylene ether, alkylphenol polyoxyethylene ether, thiourea compounds, and alkyl pyridine compounds.

* * * * *